(12) United States Patent
Cho et al.

(10) Patent No.: US 8,043,926 B2
(45) Date of Patent: Oct. 25, 2011

(54) NONVOLATILE MEMORY DEVICES INCLUDING OXYGEN-DEFICIENT METAL OXIDE LAYERS AND METHODS OF MANUFACTURING THE SAME

(75) Inventors: Sung-Il Cho, Yongin-si (KR); Choong-rae Cho, Yongin-si (KR); Eun-hong Lee, Yongin-si (KR); In-kyeong Yoo, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/926,042

(22) Filed: Oct. 22, 2010

(65) Prior Publication Data

US 2011/0059576 A1 Mar. 10, 2011

Related U.S. Application Data

(62) Division of application No. 11/798,703, filed on May 16, 2007, now Pat. No. 7,842,991.

(30) Foreign Application Priority Data

May 19, 2006 (KR) .................. 10-2006-0045154

(51) Int. Cl.
*H01L 21/02* (2006.01)

(52) U.S. Cl. ................. 438/396; 257/E21.662

(58) Field of Classification Search .......... 438/253, 438/104, 3, 240, 244, 250, 396; 257/2, 3, 257/4, E21.662
See application file for complete search history.

(56) References Cited

U.S. PATENT DOCUMENTS

| 4,892,309 | A | | 1/1990 | Kim et al. |
|---|---|---|---|---|
| 4,982,309 | A | * | 1/1991 | Shepherd ............... 361/321.3 |
| 2003/0086835 | A1 | * | 5/2003 | Suzawa et al. ............. 422/180 |
| 2003/0218222 | A1 | * | 11/2003 | Wager et al. ............. 257/410 |
| 2005/0051828 | A1 | * | 3/2005 | Park et al. ............. 257/310 |

(Continued)

FOREIGN PATENT DOCUMENTS

| CN | 1684747 | 10/2005 |
|---|---|---|
| CN | 1691334 | 11/2005 |
| EP | 1 484 799 | 12/2004 |

OTHER PUBLICATIONS

European Search Report dated Mar. 19, 2009, for corresponding European Patent Application No. 07102983.9.

(Continued)

*Primary Examiner* — Evan Pert
*Assistant Examiner* — Selim Ahmed
(74) *Attorney, Agent, or Firm* — Harness, Dickey & Pierce, PLC

(57) ABSTRACT

A nonvolatile memory device includes at least one switching device and at least one storage node electrically connected to the at least one switching device. The at least one storage node includes a lower electrode, one or more oxygen-deficient metal oxide layers, one or more data storage layers, and an upper electrode. At least one of the one or more metal oxide layers is electrically connected to the lower electrode. At least one of the one or more data storage layers is electrically connected to at least one of the one or more metal oxide layers. The upper electrode is electrically connected to at least one of the one or more data storage layers. A method of manufacturing the nonvolatile memory device includes preparing the at least one switching device and forming the lower electrode, one or more metal oxide layers, one or more data storage layers, and upper electrode.

10 Claims, 6 Drawing Sheets
(4 of 6 Drawing Sheet(s) Filed in Color)

U.S. PATENT DOCUMENTS

2005/0247921 A1* 11/2005 Lee et al. .................. 257/2
2005/0282635 A1    12/2005 Aoki
2006/0022245 A1*  2/2006 Jeong et al. ................ 257/296
2006/0054950 A1    3/2006 Baek et al.
2006/0088731 A1*  4/2006 Kijima et al. ............... 428/701

OTHER PUBLICATIONS

Chen et al., "Perovskite RRAM Devices with Metal/Insulator/PCMO/Metal Heterostructures" Non-Volatile Memory Technology Symposium, Nov. 7, 2005, pp. 125-128, XP010854264.

Hyunjun et al., Excellent Resistance Switching Characteristics of Pt/Single-crystal Nb-Doped $SrTiO_3$ Schottky Junction, Non-Volatile Semiconductor Memory Workshop, 2006. Feb. 12, 2006, pp. 88-89, XP010916678.

Office Action for corresponding Chinese Patent Application No. 200610165950.5 dated Jun. 19, 2009.

Chinese Office Action dated Feb. 5, 2010 with English translation for corresponding Chinese Application No. 200610165950.5.

\* cited by examiner

NONVOLATILE MEMORY DEVICES INCLUDING OXYGEN-DEFICIENT METAL OXIDE LAYERS AND METHODS OF MANUFACTURING THE SAME

PRIORITY STATEMENT

This U.S. nonprovisional application is a divisional of U.S. application Ser. No. 11/798,703 filed May 16, 2007 now U.S. Pat. No. 7,842,991, which claims priority under 35 U.S.C. §119 to Korean Patent Application No. 10-2006-0045154, filed on May 19, 2006, in the Korean Intellectual Property Office (KIPO), the entire contents of each of which is incorporated herein by reference.

BACKGROUND

1. Field

Example embodiments relate to nonvolatile memory devices including one or more oxygen-deficient metal oxide layers and methods of manufacturing the same. Also, example embodiments relate to nonvolatile memory devices including one or more storage nodes in which one or more oxygen-deficient metal oxide layers is formed between at least one lower electrode and at least one data layer and methods of manufacturing the same.

2. Description of Related Art

A related art dynamic random access memory (DRAM) consists of a unit cell of 1T/1C (one transistor and one capacitor) structure. As the size of the DRAM decreases, the difficulty of manufacturing the transistor and/or capacitor increases, and thus, high yield manufacturing of DRAM cells is difficult. Therefore, it is desirable to develop a nonvolatile memory that may replace the related art DRAM. Attempts have been made to develop high integration density, low power consumption DRAMs, nonvolatile flash memories, and high operation speed static random access memories (SRAMs) as next generation memories. Such devices include phase change RAMs (PRAMs), nano floating gate memories (NFGMs), resistance RAMs (ReRAMs), polymer RAMs (PoRAMs), magnetic RAMs (MRAMs), and molecular electronic devices.

The ReRAM device may include a Metal Insulating Metal (MIM) structure using a metal oxide, and may show memory characteristics that, when an appropriate electrical signal is applied, the state of the MIM structure may change from a high resistance non-conductive state (i.e., an off-state) to a low resistance conductive state (i.e., an on-state), and vice versa. For the acronym MIM, M means upper and lower metal electrodes, and I means a data storage layer formed of an insulating material.

When switching is repeated in a storage node of a related art MIM memory cell structure, the distribution of the set and reset voltage values ($V_{set}$ and $V_{reset}$) applied to the storage node may demonstrate a large deviation, and the distribution of the resistance values ($R_{on}$ and $R_{off}$) of the storage node according to on and off states is not uniform.

SUMMARY

Example embodiments may provide a nonvolatile memory device including a structure that improves stability of memory switching characteristics in at least one storage node.

Example embodiments may provide a method of manufacturing a nonvolatile memory device including at least one storage node.

According to example embodiments, a nonvolatile memory device may include at least one switching device and at least one storage node electrically connected to the at least one switching device. The at least one storage node may include a lower electrode; one or more oxygen-deficient metal oxide layers; one or more data storage layers; and/or an upper electrode. At least one of the one or more metal oxide layers may be electrically connected to the lower electrode, at least one of the one or more data storage layers may be electrically connected to at least one of the one or more metal oxide layers, and/or the upper electrode may be electrically connected to at least one of the one or more data storage layers. At least one of the one or more metal oxide layers may be formed on the lower electrode, at least one of the one or more data storage layers may be formed on at least one of the one or more metal oxide layers, and/or the upper electrode may be formed on at least one of the one or more data storage layers. In addition or in the alternative, at least one of the one or more data storage layers may be formed on the upper electrode, at least one of the one or more metal oxide layers may be formed on at least one of the one or more data storage layers, and/or the lower electrode may be formed on at least one of the one or more metal oxide layers. The at least one switching device may include, for example, a transistor and/or a diode.

At least one of the one or more oxygen-deficient metal oxide layers may have one or more oxygen vacancies. Additionally or in the alternative, at least one of the one or more oxygen-deficient metal oxide layers may have a resistivity greater than a conductive metal oxide and less than the one or more data storage layers.

At least one of the one or more oxygen-deficient metal oxide layers may include, for example, one or more of ITO, IZO, $RuO_2$, ZnO, and ZrO.

At least one of the one or more oxygen-deficient metal oxide layers may be formed, for example, of one or more of ITO, IZO, $RuO_2$, ZnO, and ZrO.

At least one of the one or more oxygen-deficient metal oxide layers may be an ITO layer, an IZO layer, a $RuO_2$ layer, a ZnO layer, and/or a ZrO layer.

At least one of the one or more oxygen-deficient metal oxide layers may have a thickness greater than or equal to about 1 nm and less than or equal to about 50 nm. A total thickness of the one or more oxygen-deficient metal oxide layers may be greater than or equal to about 1 nm and less than or equal to about 50 nm.

The upper electrode may include, for example, one or more of Au, Cr, Cu, Ir, Ni, Pd, Pt, Ru, and TiN, and/or the lower electrode may include, for example, one or more of Au, Cr, Cu, Ir, Ni, Pd, Pt, Ru, and TiN. In addition or in the alternative, the upper electrode may be formed, for example, of one or more of Au, Cr, Cu, Ir, Ni, Pd, Pt, Ru, and TiN, and/or the lower electrode may be formed, for example, of one or more of Au, Cr, Cu, Ir, Ni, Pd, Pt, Ru, and TiN. The upper and lower electrodes may comprise the same or different materials. The upper and lower electrodes may be formed of the same or different materials.

The upper electrode may include, for example, Pt and/or the lower electrode may include, for example, Ru. In addition or in the alternative, the upper electrode may be formed, for example, of Pt and/or the lower electrode may be formed, for example, of Ru.

At least one of the one or more data storage layers may include one or more of $Al_2O_3$, CoO, $Nb_2O_5$, NiO, $TiO_2$, $V_2O_5$, $WO_3$, and ZnO. In addition or in the alternative, at least one of the one or more data storage layers may be formed, for example, of one or more of $Al_2O_3$, CoO, $Nb_2O_5$, NiO, $TiO_2$, $V_2O_5$, $WO_3$, and ZnO.

According to example embodiments, a method of manufacturing a nonvolatile memory device may include preparing at least one switching device; forming a lower electrode electrically connected to the at least one switching device; forming one or more oxygen-deficient metal oxide layers; forming one or more data storage layers; and/or forming an upper electrode. At least one of the one or more metal oxide layers may be electrically connected to the lower electrode, at least one of the one or more data storage layers may be electrically connected to at least one of the one or more metal oxide layers, and/or the upper electrode may be electrically connected to at least one of the one or more data storage layers.

The at least one switching device may include, for example, a transistor and/or a diode.

BRIEF DESCRIPTION OF THE DRAWINGS

The patent or application file contains at least one drawing executed in color. Copies of this patent or patent application publication with color drawing(s) will be provided by the U.S. Patent and Trademark Office upon request and payment of the necessary fee.

The above and/or other aspects and advantages will become more apparent and more readily appreciated from the following detailed description of example embodiments taken in conjunction with the accompanying drawings, in which.

DETAILED DESCRIPTION OF EXAMPLE EMBODIMENTS

Figure 1:
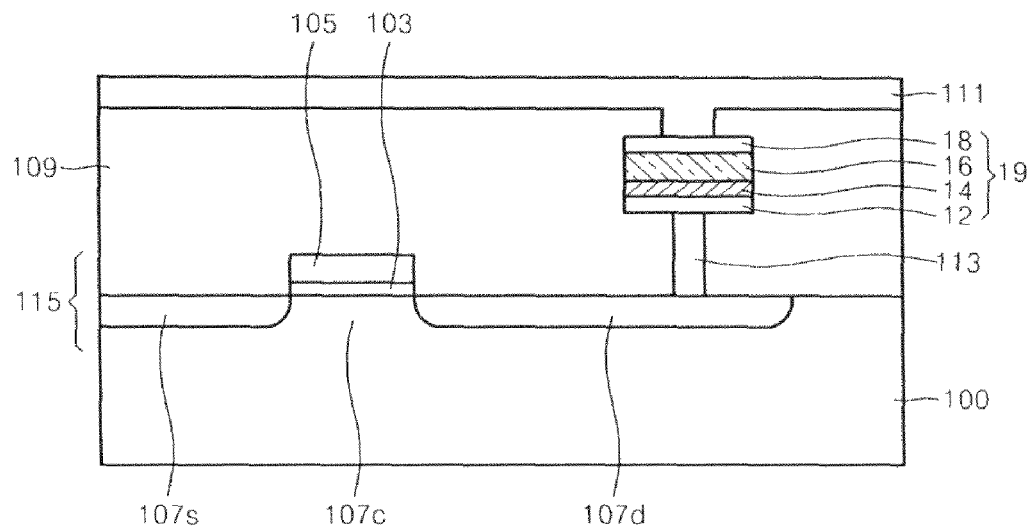
FIG. 1 is a cross-sectional view illustrating a nonvolatile memory device according to an example embodiment.

Example embodiments will now be described more fully with reference to the accompanying drawings. Embodiments may, however, be embodied in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to," or "coupled to" another component, it may be directly on, connected to, or coupled to the other component or intervening components may be present. In contrast, when a component is referred to as being "directly on," "directly connected to," or "directly coupled to" another component, there are no intervening components present. As used herein, the term "and/or" includes any and all combinations of one or more of the associated listed items.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the example embodiments.

Spatially relative terms, such as "beneath," "below," "lower," "above," "upper," and the like may be used herein for ease of description to describe one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to the like components throughout.

FIG. 1 is a cross-sectional view illustrating a nonvolatile memory device according to an example embodiment.

Referring to FIG. 1, the nonvolatile memory device may include a transistor 115 and/or a storage node 19 electrically connected to the transistor 115. The transistor 115 may include a source 107s, a drain 107d, a channel 107c, an insulation layer 103, and/or a gate electrode 105. The storage node 19 may include an upper electrode 18, a lower electrode 12, an oxygen-deficient metal oxide layer 14 interposed between the upper electrode 18 and the lower electrode 12, and/or a data storage layer 16 interposed between the upper electrode 18 and the lower electrode 12. The nonvolatile memory device also may include a substrate 100 and/or an insulating layer 109 at least partially disposed between the storage node 19 and the transistor 115. The storage node 19 may be electrically connected to the transistor 115 by a conductive contact plug 113, and/or a plate electrode 111 may be disposed on the upper electrode 18 of the storage node 19.

Figure 2:
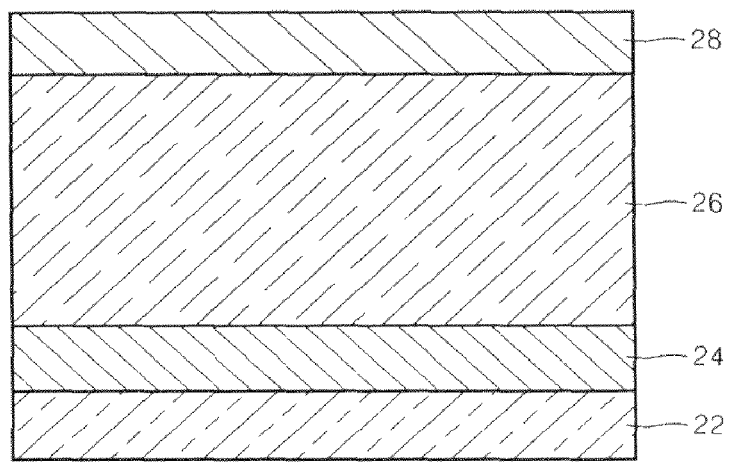
FIG. 2 is a cross-sectional view illustrating a structure of one or more storage nodes of the nonvolatile memory device according to an example embodiment.

FIG. 2 is a cross-sectional view illustrating a structure of one or more storage nodes of the nonvolatile memory device according to an example embodiment. Referring to FIG. 2, the one or more storage nodes may include the lower electrode 22, at least one of the one or more oxygen-deficient metal oxide layers 24 electrically connected to the lower electrode 22, at least one of the one or more data storage layers 26 electrically connected to at least one of the one or more oxygen-deficient metal oxide layers 24, and/or the upper electrode 28 electrically connected to at least one of the one or more data storage layers 26. At least one of the one or more oxygen-deficient metal oxide layers 24 may be formed on the lower electrode 22, at least one of the one or more data storage layers 26 may be formed on at least one of the one or more oxygen-deficient metal oxide layers 24, and/or the upper electrode 28 may be formed on at least one of the one or more data storage layers 26. In addition or in the alternative, at least one of the one or more data storage layers 26 may be formed on the upper electrode 28, at least one of the one or more oxygen-deficient metal oxide layers 24 may be formed on at least one of the one or more data storage layers 26, and/or the lower electrode 22 may be formed on at least one of the one or more oxygen-deficient metal oxide layers 24.

Example embodiments of the upper electrode 28 and/or the lower electrode 22 may include one or more of Au, Cr, Cu, Ir, Ni, Pd, Pt, Ru, and TiN. Example embodiments of the upper electrode 28 may include Pt and/or example embodiments of the lower electrode 22 may include Ru. Example embodiments of the upper electrode 28 and/or the lower electrode 22 may have a thickness greater than or equal to about 10 nm and less than or equal to about 200 nm. The upper electrode 28 and/or the lower electrode 22 may be formed, for example, using a sputtering method, an electron beam deposition method, and/or a chemical vapor deposition (CVD) method.

The at least one of the one or more oxygen-deficient metal oxide layers 24 electrically connected to the lower electrode 22 denotes one or more metal oxide layers that may include one or more oxygen vacancies. The one or more oxygen vacancies that may be included in the one or more metal oxide layers may absorb oxygen when a voltage is applied, and the oxygen concentrated at an interface between the at least one of the one or more data storage layers 26 and the at least one of the one or more oxygen-deficient metal oxide layers 24 may improve the switching characteristics of a memory by influencing the disconnection to a metal filament. The one or more oxygen-deficient metal oxide layers may be one or more metal oxide layers having one or more oxygen vacancies and may have resistivity greater than a conductive metal oxide (i.e., $IrO_2$, $MoO_2$, $OsO_2$, $ReO_2$, $RhO_2$, $RuO_2$, $SrRuO_3$, and $WO_2$) and less than the data storage layer 26 (i.e., $Al_2O_3$, CoO, $Nb_2O_5$, NiO, $TiO_2$, $V_2O_5$, $WO_3$, and/or ZnO).

Example embodiments of the one or more oxygen-deficient metal oxide layers 24 may have a thickness greater than or equal to about 1 nm and less than or equal to about 50 nm. Example embodiments of the one or more oxygen-deficient metal oxide layers 24 may have a total thickness greater than or equal to about 1 nm and less than or equal to about 50 nm. Example embodiments of the one or more oxygen-deficient metal oxide layers 24 may comprise one or more of ITO, IZO, ZnO, ZrO, and/or $RuO_2$. When the thickness of the one or more oxygen-deficient metal oxide layers 24 exceeds about 50 nm, the switching characteristics of the memory may not be exhibited. Similarly, when the total thickness of the one or more oxygen-deficient metal oxide layers 24 exceeds about 50 nm, the switching characteristics of the memory may not be exhibited.

At least one of the one or more oxygen-deficient metal oxide layers 24 may be formed, for example, using a sputtering method, a pulse laser deposition method, a CVD method, an organic metal vapor deposition method, a sol-gel method, and/or a spray thermal decomposition method.

At least one of the one or more oxygen-deficient metal oxide layers 24 may be formed, for example, of ZnO.

ZnO may be formed as an insulator, a semiconductor, and/or a conductor according to process conditions and method of forming. When a ZnO thin film is formed, the degree of conductivity and oxygen vacancies varies according to the oxygen partial pressure. For example, it is known that a lot of oxygen vacancies may be created when the ZnO thin film is formed at low oxygen partial pressure. As described above, ZnO may be a desirable material since the creation of oxygen vacancies may be controlled together with the conductivity characteristics of the ZnO.

To form at least one of the one or more oxygen-deficient metal oxide layers 24 using ZnO, the one or more oxygen-deficient metal oxide layers 24 may be formed, for example, using a ZnO target as a raw material at an oxygen partial pressure of 50% or less by additionally injecting oxygen at a temperature of 50° C. or less using a reactive sputtering method.

At least one of the one or more data storage layers 26 may be formed, for example, of a transitional metal oxide having variable resistance characteristics. For example, at least one of the one or more data storage layers 26 may be formed of one or more of $Al_2O_3$, CoO, $Nb_2O_5$, NiO, $TiO_2$, $V_2O_5$, $WO_3$, and ZnO.

FIGS. 3A through 3D are cross-sectional views illustrating a method of manufacturing one or more storage nodes according to an example embodiment. In a nonvolatile memory device, the method of manufacturing a semiconductor switching device that includes a source, drain, channel, and gate electrode is well known to one of ordinary skill in the art.

Figure 3A:
FIGS. 3A through 3D are cross-sectional views illustrating a method of manufacturing one or more storage nodes according to an example embodiment.

Referring to FIG. 3A, the lower electrode 32 may be formed, for example, on a silicon substrate 30. Example embodiments of the lower electrode 32 may include one or more of Au, Cr, Cu, Ni, Ir, Pd, Pt, Ru, and TiN. Example embodiments of the lower electrode 32 may include Ru. Example embodiments of the lower electrode 32 may have a thickness greater than or equal to about 10 nm and less than or equal to about 200 nm. The lower electrode 32 may be formed, for example, using a sputtering method, an electron beam deposition method, and/or a CVD method.

Figure 3B:
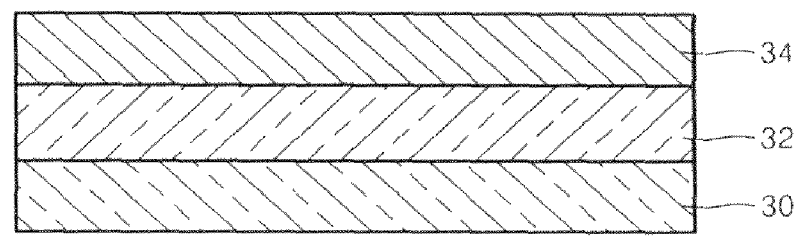

Referring to FIG. 3B, one or more oxygen-deficient metal oxide layers 34 may be formed, for example, on the lower electrode 32. At least one of the one or more oxygen-deficient metal oxide layers 34 may have a thickness greater than or equal to about 1 nm and less than or equal to about 50 nm. A total thickness of the one or more oxygen-deficient metal oxide layers 34 may be greater than or equal to about 1 nm and less than or equal to about 50 nm. At least one of the one or more oxygen-deficient metal oxide layers may include one or more metal oxides, such as ITO, IZO, $RuO_2$, ZnO, ZrO, etc.

At least one of the one or more oxygen-deficient metal oxide layers 34 may be formed, for example, using a sputtering method, a pulse laser deposition method, a CVD method, an organometal vapor deposition method, a sol-gel method, and/or a spray thermal decomposition method.

Figure 3C:
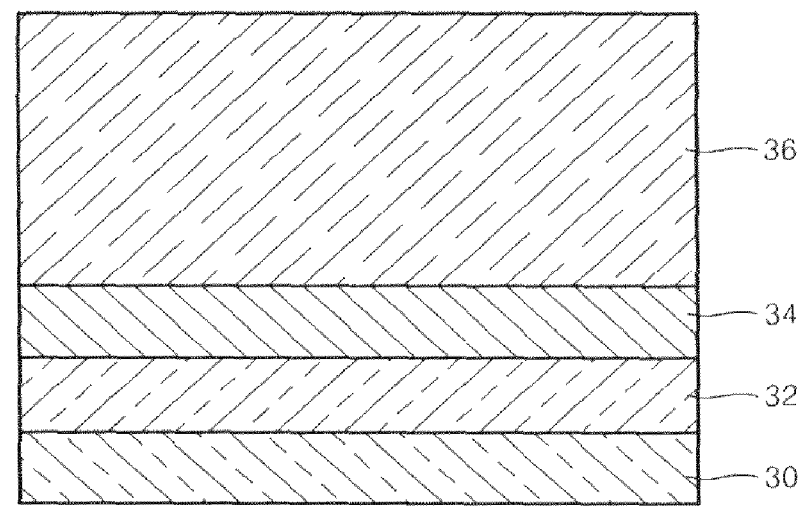
Figure 3D:
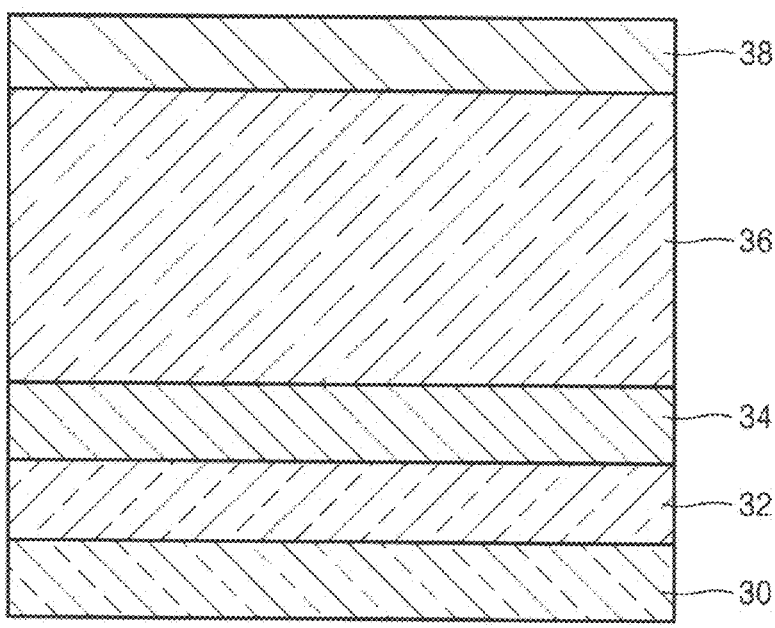

Referring to FIGS. 3C and 3D, a data storage layer 36 may be formed, for example, on the oxygen-deficient metal oxide layer 34, and an upper electrode 38 may be formed, for example, on the data storage layer 36.

The data storage layer 36 may include one or more of $Al_2O_3$, CoO, $Nb_2O_5$, NiO, $TiO_2$, $V_2O_5$, $WO_3$, and ZnO.

The upper electrode 38 may include the same material as or different material from the lower electrode 32. Example embodiments of the upper electrode 38 may include Pt.

Figure 4:
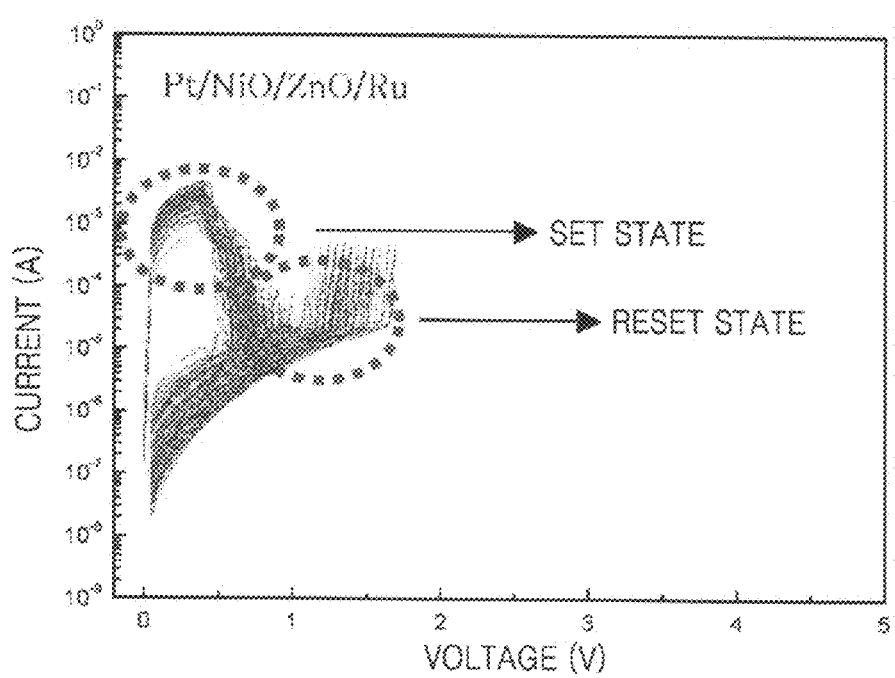
FIG. 4 is an I-V curve showing the switching characteristics of a nonvolatile memory device according to an example embodiment.
Figure 5:
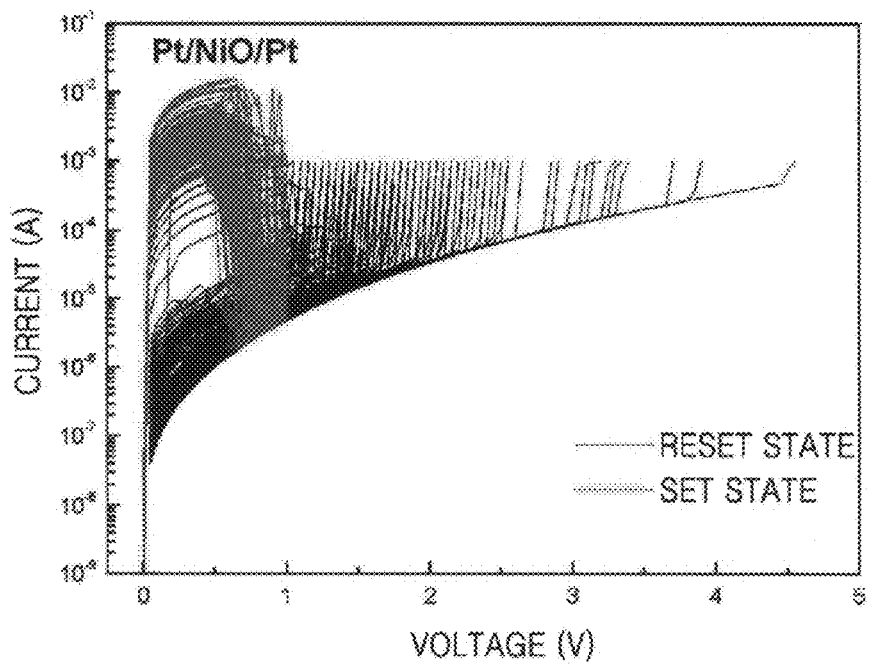
FIG. 5 is an I-V curve showing the switching characteristics of a related art nonvolatile memory device.

FIG. 4 is an I-V curve showing the switching characteristics of a nonvolatile memory device according to an example embodiment. The nonvolatile memory device may include one or more storage nodes having, for example, a Pt/NiO/ZnO/Ru structure. FIG. 5 is an I-V curve showing the switching characteristics of a related art nonvolatile memory device. The nonvolatile memory device may include a storage node having a Pt/NiO/Pt structure in which the oxygen-deficient metal oxide layer 34 is not included.

Referring to FIGS. 4 and 5, the storage node having the Pt/NiO/ZnO/Ru structure realizes a relatively uniform and stable distribution of set and reset voltage values $V_{set}$ and $V_{reset}$ that are applied to the storage node when compared to that of the related art Pt/NiO/Pt structure. Here, $V_{set}$ is a voltage that sets transition, and $V_{reset}$ is a voltage at maximum current peak when transition is reset.

Figure 6:
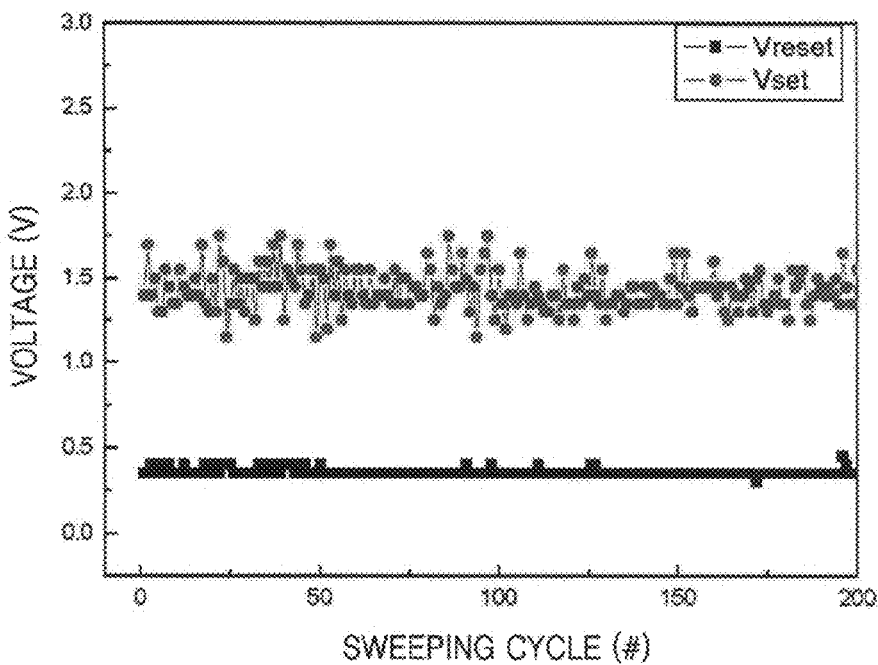
FIG. 6 is a graph showing a distribution of set and reset voltage values applied to a nonvolatile memory device according to an example embodiment.
Figure 7:
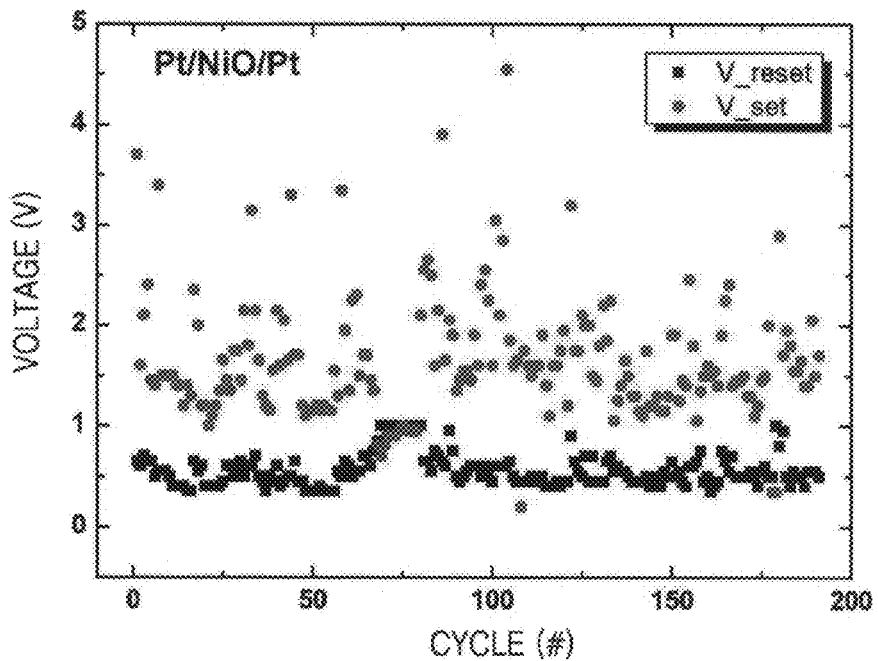
FIG. 7 is a graph showing a distribution of set and reset voltage values applied to a related art nonvolatile memory device.

FIG. 6 is a graph showing a distribution of set and reset voltage values applied to a nonvolatile memory device according to an example embodiment. The nonvolatile memory device may include one or more storage nodes having, for example, a Pt/NiO/ZnO/Ru structure. FIG. 7 is a graph showing a distribution of set and reset voltage values applied to a related art nonvolatile memory device. The nonvolatile memory device may include a storage node having a Pt/NiO/Pt structure.

Referring to FIGS. 6 and 7, it is seen that the standard deviation of the $V_{set}$ and $V_{reset}$ with respect to the switching cycle in the storage node having a Pt/NiO/ZnO/Ru structure according to an example embodiment is lower than a standard deviation of the $V_{set}$ and $V_{reset}$ with respect to the switching cycle in the related art storage node having the Pt/NiO/Pt structure.

Figure 8:
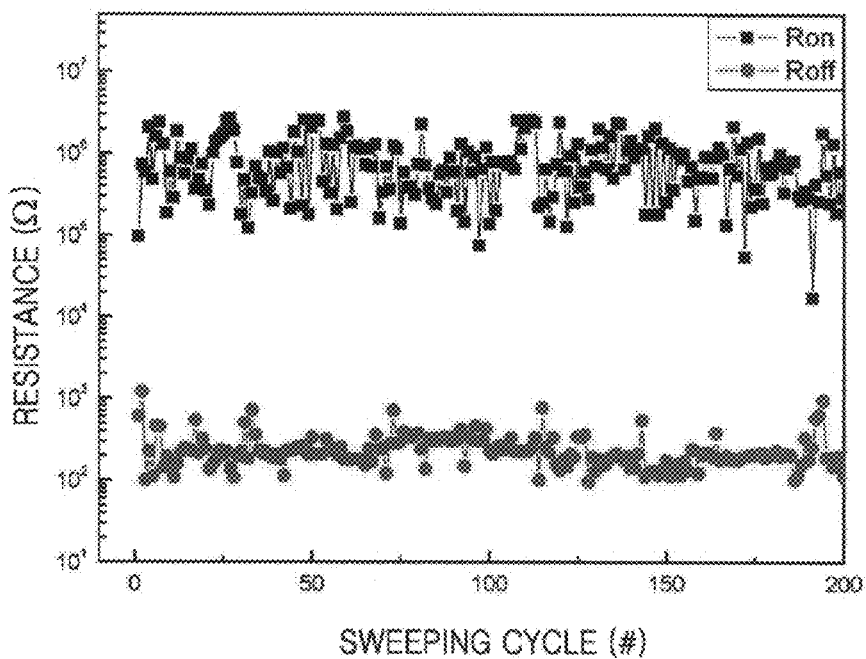
FIG. 8 is a graph showing a distribution of resistance values of one or more storage nodes according to on/off states during switching of a nonvolatile memory device according to an example embodiment.
Figure 9:
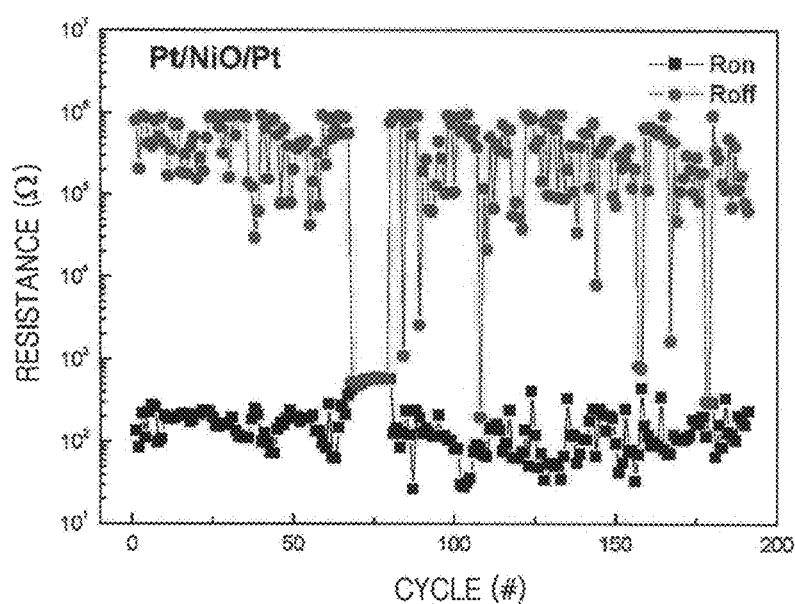
FIG. 9 is a graph showing a distribution of resistance values of a storage node according to on/off states during switching of a related art nonvolatile memory device.

FIG. 8 is a graph showing a distribution of resistance values of one or more storage nodes according to on/off states during switching of a nonvolatile memory device according to an example embodiment. The one or more storage nodes may have, for example, a Pt/NiO/ZnO/Ru structure. FIG. 9 is a graph showing a distribution of resistance values of a storage node according to on/off states during switching of a related art nonvolatile memory device. The nonvolatile memory device may include a storage node having a Pt/NiO/Pt structure.

Referring to FIGS. 8 and 9, in the storage node having the Pt/NiO/ZnO/Ru structure according to an embodiment of the present invention, the standard deviation of Ron and Roff with respect to the switching cycle is lower than the standard deviation of Ron and Roff of the related art storage node having the Pt/NiO/Pt structure.

Accordingly, the memory characteristics may improve in a storage node structure according to the example embodiments through the reduction of the standard deviation of Ron and Roff.

As described above, according to the example embodiments, stable memory switching characteristics may be obtained by employing one or more oxygen-deficient metal oxides in one or more storage nodes. For example, when switching is repeated, the standard deviation of set and reset voltages applied to the storage node and the standard deviation of resistance according to on and off states may be reduced.

While example embodiments have been particularly shown and described, it will be understood by those of ordinary skill in the art that various changes in form and details may be made therein without departing from the spirit and scope of the present invention as defined by the following claims.

What is claimed is:

1. A method of manufacturing a nonvolatile memory device, comprising:
   preparing at least one switching device; and
   forming a storage node, the forming a storage node including
   forming a lower electrode electrically connected to the at least one switching device,
   forming one or more oxygen-deficient metal oxide layers such that at least one of the one or more metal oxide layers includes one or more of ITO, IZO, RuO2, ZnO, and ZrO, and at least one of the one or more metal oxide layers is electrically connected to the lower electrode,
   forming one or more data storage layers such that at least one of the one or more data storage layers includes one or more of Al2O3, CoO, Nb2O5, NiO, TiO2, V2O5, WO3, and ZnO, at least one of the one or more data storage layers is electrically connected to at least one of the one or more metal oxide layers, and a material of at least one of the metal oxide layers is different from a material of at least one of the data storage layers, and
   forming an upper electrode electrically connected to at least one of the one or more data storage layers,
   wherein the forming a storage node includes forming the storage node to absorb oxygen at one or more oxygen vacancies of the one or more metal oxide layers upon application of a voltage.

2. The method of claim 1, wherein the forming a storage node includes forming at least one of the one or more metal oxide layers to a thickness greater than or equal to about 1 nm and less than or equal to about 50 nm.

3. The method of claim 1, wherein the forming a storage node includes forming the one or more metal oxide layers to a total thickness greater than or equal to about 1 nm and less than or equal to about 50 nm.

4. The method of claim 1, wherein the forming a storage node includes forming at least one of the one or more metal oxide layers using one of a sputtering method, a pulse laser deposition method, a chemical vapor deposition (CVD) method, an organic metal vapor deposition method, a sol-gel method, and a spray thermal decomposition method.

5. The method of claim 1, wherein at least one of the one or more metal oxide layers is a ZnO layer.

6. The method of claim 5, wherein the forming a storage node includes forming the ZnO layer using a ZnO target as raw material at an oxygen partial pressure of about 50% or less by additionally injecting oxygen, at a temperature of about 50° C. or less, using a reactive sputtering method.

7. The method of claim 1, wherein the upper electrode includes one or more of Au, Cr, Cu, Ir, Ni, Pd, Pt, Ru, and TiN, and
   the forming a storage node includes forming the upper electrode using one of a sputtering method, an electron beam deposition method, and a chemical vapor deposition (CVD) method.

8. The method of claim 1, wherein the lower electrode includes one or more of Au, Cr, Cu, Ir, Ni, Pd, Pt, Ru, and TiN, and the forming a storage node includes forming the lower electrode using one of a sputtering method, an electron beam deposition method, and a chemical vapor deposition (CVD) method.

9. The method of claim 1, wherein the upper electrode includes Pt.

10. The method of claim 1, wherein the lower electrode includes Ru.

* * * * *